United States Patent [19]

Anderson, Jr. et al.

[11] Patent Number: 4,772,346
[45] Date of Patent: Sep. 20, 1988

[54] METHOD OF BONDING INORGANIC PARTICULATE MATERIAL

[75] Inventors: Herbert R. Anderson, Jr., Patterson; Constance J. Araps, Wappingers Falls, both of N.Y.; Renuka S. Divakaruni, Ridgefield, Conn.; Daniel P. Kirby, Poughkeepsie, N.Y.; Robert W. Nufer, Hopewell Junction, N.Y.; Harbans S. Sachdev; Krishna G. Sachdev, both of Wappingers Falls, N.Y.; Darbha Suryanarayana, Vestal, N.Y.; Stoyan M. Zalar, Poughkeepsie, N.Y.

[73] Assignee: International Business Machines Corporation, Armonk, N.Y.

[21] Appl. No.: 115,568

[22] Filed: Oct. 29, 1987

Related U.S. Application Data

[63] Continuation of Ser. No. 829,344, Feb. 14, 1986, abandoned.

[51] Int. Cl.$^4$ ............... C04B 35/00; C03C 10/00
[52] U.S. Cl. ............................. 156/89; 501/1; 501/2; 501/128; 501/153; 427/96; 427/126.2; 264/61; 264/63
[58] Field of Search ............... 501/1, 2, 128, 153; 427/96, 126.2; 264/61, 63; 156/89

[56] References Cited

U.S. PATENT DOCUMENTS

| 2,966,719 | 1/1961 | Park, Jr. ................. | 264/63 |
| 3,090,691 | 5/1963 | Weyer .................... | 264/63 |
| 3,502,520 | 3/1970 | Schwartz ................ | 264/63 |
| 3,740,243 | 6/1973 | Kappes et al. ......... | 501/153 X |
| 3,780,150 | 12/1973 | Stetson et al. ......... | 501/153 X |
| 3,994,740 | 11/1976 | Morton .................. | 501/128 X |
| 4,080,414 | 3/1978 | Anderson et al. ..... | 264/63 X |
| 4,094,690 | 6/1978 | Morton .................. | 501/128 X |
| 4,255,316 | 3/1981 | Blizzard ................. | 501/153 X |
| 4,279,654 | 7/1981 | Yajima et al. ......... | 501/153 X |
| 4,387,195 | 6/1983 | Tulley et al. .......... | 501/153 X |
| 4,460,638 | 7/1984 | Haluska ................. | 156/89 X |

FOREIGN PATENT DOCUMENTS

| 0164841 | 12/1985 | European Pat. Off. ....... | 264/61 |
| 0239353 | 11/1985 | Japan ........................... | 501/153 |

Primary Examiner—Mark L. Bell
Assistant Examiner—Karl Group
Attorney, Agent, or Firm—Ira David Blecker

[57] ABSTRACT

In a process for forming elements from a slurry that includes particulate ceramic and/or glass, an organic binder resin, and a solvent for the resin, where the element is shaped from the slurry, and the element heated to remove the organic materials of the slurry and subsequently fuse the ceramic and/or glass particles, the improvement comprised of coating the ceramic and/or glass particles prior to forming the slurry with a surface modification compound selected from the group consisting of organo silanes, organo silazanes, titanium chelates, titanium esters, and mixtures thereof.

18 Claims, No Drawings

METHOD OF BONDING INORGANIC PARTICULATE MATERIAL

This application is a continuation, of application Ser. No. 829,344, filed 2/14/86 abandoned.

DESCRIPTION

TECHNICAL FIELD

This invention relates to bonding inorganic particulate materials, and more particularly to the production of multilayer ceramic substrates comprised of sintered ceramic or glass-ceramic materials with an internal metal base conductor pattern. More particularly, the invention relates to a method of fabricating glass-ceramic substrates for semiconductor packages that embody an internal conductive metallurgy system wherein a surface modification coating is provided for assisting in the removing of the resin binder from the laminate structure without degrading the internal metallurgy system and/or the ceramic and for improving the dielectric and electrical properties of the resultant ceramic.

BACKGROUND ART

Because of the high package density attainable with multilayer ceramic (MLC) substrate circuit structure, it has achieved extensive acceptance in the electronics industry for the packaging of semiconductor integrated circuit semiconductor devices, and other elements; as for example, see U.S. Pat. No. 3,379,943 granted Apr. 23, 1968 to J. D. Breedloff, U.S. Pat. No. 3,502,520 granted Mar. 24, 1970 to B. Schwartz, U.S. Pat. No. 4,080,414 granted Mar. 21, 1978 to L. C. Anderson, et al, and U.S. Pat. No. 4,234,367 to L. W. Herron, et al granted Nov. 18, 1980.

In general, these ceramic structures are formed from ceramic green sheets, which sheets are prepared from a ceramic slurry by mixing a ceramic particulate, a thermoplastic polymer (e.g. polyvinylbutyral) and a solvent. This mixture is then cast or spread onto ceramic sheets or slips from which the solvents are subsequently volatilized to provide a coherent and self-supporting flexible green sheet. These green ceramic sheets are laminated to form a substrate which is fired to drive off and/or burn off the resin, and subsequently sintered to fuse the ceramic particulates together into a densified ceramic substrate.

In the fabrication of multilayer ceramic structures, an electrically conductive paste composition is deposited in patterns on pre-punched green sheets, which when laminated and sintered collectively form the desired internal metallurgy circuit structure. The component green ceramic sheets have via or feed through holes punched in them as required for level interconnection in the ultimate structure. The required number of component green sheets are stacked on each other in the required order. The stack of green sheets is then compressed or compacted at the necessary temperatures and pressures to affect a bond between adjacent layers. The overall process is more completely described in "Ceramics For Packaging" by D. L. Wilcox, *Solid State Technology*, Feb. 1971 P. 55-60, and in an article entitled "A Fabrication Technique For Multilayer Ceramic Modules" by H. D. Kaiser et al, *Solid State Technology*, May 1972 P. 35-40.

Alumina, $Al_2O_3$, because of its excellent insulating properties, thermal conductivity, stability and strength has received wide acceptance as the material of choice for fabrication of such MLC substrates. However, for various high performance applications, the relatively high dielectric constant of alumina causes significant signal propagation delays and noise. A further disadvantage of alumina is its relatively high thermal expansion coefficient difference, on the order of 65 to $70 \times 10^{-7}$ per $°$ C., as compared to monocrystalline silicon with a coefficient from 25 to $30 \times 10^{-7}$ per $°$ C. This difference may in certain cases result in some design and reliability concerns, particularly when a silicon device chip is joined to the substrate with solder interconnections.

A particular disadvantage is that the high sintering and maturing temperature of commercial alumina (about 1600$°$ C.), restricts the choice of co-sinterable conductive metals to refractory metals, such as tungsten, molybdenum, platinum, palladium, or a combination thereof. The high sintering temperature precludes the use of metals with higher electrical conductivities such as gold, silver or copper because the latter would be molten before the sintering temperature of alumina is reached.

A multilayer glass ceramic structure is disclosed and claimed in U.S. Pat. No. 4,341,324 by A. H. Kumar et al, whose teachings are incorporated herein by reference thereto, which avoids the use of and the attendant disadvantages of alumina ceramic. The disclosed multilayer glass-ceramic structures are characterized with low dielectric constants and are compatible with thick film circuitry of gold, silver, or copper and are co-fired therewith. Of the two types of glass-ceramics disclosed in the aforementioned patent, one has $\beta$-Spodumene, $Li_2O \cdot Al_2O_3 \cdot 4SiO_2$, as the principal crystalline phase while the other has cordierite, $2MgO \cdot 2Al_2O_3 \cdot 5SiO_2$, as the main crystalline phase. A common feature of these sintered glass-ceramics, among others, is their excellent sinterability and crystallization capability below 1,000$°$ C.

However, it was found that silver has a tendency to cause electromigration problems and is suspected of diffusing into the glass ceramic.

Although successful glass-ceramic substrates have been made using gold metallurgy with a resistivity about 3.75 microhm-centimeter, gold is however extremely expensive. This limits the choice to copper as a practical economic alternative. Also, any alloying of other less expensive metals with gold would result in the disadvantage of an increase in resistivity.

The use of copper is relatively new in the thick film technology. Because of copper's oxidizing potential, it is necessary to sinter multilayer ceramic substrates in reducing or neutral ambients. However, since reducing ambients can occasion adhesion problems, neutral ambients are preferable.

In the fabrication of multilevel glass-ceramic structures, difficulty has been encountered in removing the resin binders that are used to produce the slurry for processing.

It is generally recognized that burn-out of organic binders used for ceramic package fabrication is a very demanding process, especially in the fabrication of a glass-ceramic and Cu metallurgy system. The reducing atmosphere or low oxygen atmosphere required to prevent oxidation of Cu, typically $H_2 + N_2 + H_2O$ or $H_2 + H_2O$ employed in the presintering and densification phase, leads to incomplete removal of carbon formed as a consequence of binder pyrolysis. The carbonaceous residues thus generated become an integral part of the ceramic substrate after sintering and densification.

With the use of glass-ceramics and copper metallurgy, the maximum temperature for binder removal, due to the coalescence of glass particles, is in the range of about 800°–875° C. Thus, after the glass has coalesced, any remaining binder residue will become entrapped in the glass body. It has also been found that nitrogen or other neutral or reducing ambients make difficult the removal of binder below the temperature of the glass coalescence, e.g. about 800°–875° C., which can result in black or darkened substrates that are not fully sintered. The black or darkened color is generally attributed to carbon residue trapped in the ceramic. The carbon residue can have an adverse affect on the electrical characteristics of the resultant substrate, as by reducing the resistivity and having an adverse affect on the dielectric constant of the material.

Various efforts have been made to alleviate complete binder removal. Some difficulties are encountered with various neutral or reducing atmospheres, which include wet and dry nitrogen, wet and dry forming gas, long holds at temperatures below the coalescence temperature of glass-ceramic so as not to entrap volatile products, and alternating air and forming gas for purposes of oxidizing carbon and reducing any form of copper-oxide to copper without drastic volume changes resulting from the copper oxide formation. In addition, attempts have been made to develop binder vehicle systems which would by some mechanism burn off without any remaining carbonaceous residue and thereby not have darkened the substrates. In general, these efforts resulted in other attendant disadvantages even though characterized with improved burn-out properties.

U.S. Pat. No. 4,234,367 by Herron et al, issued Nov. 18, 1980, discloses and claims a method of forming a glass-ceramic composite structure with a copper-based metallurgy. In this process, laminated green ceramic substrates are heated in a $H_2/H_2O$ environment to a burn-out temperature in the range between the anneal and softening point of the glass-ceramic material which temperature is less than the melting point of the copper. The conditions are sufficient to remove the binder without oxidizing the copper metallurgy. The resultant binder-free laminate is then heated in a nitrogen atmosphere at a somewhat higher temperature to coalesce the glass particles. The copper is prevented from oxidizing in this later heating phase by the inert atmosphere.

While the process is operable and effective, the binder removal heating step is quite lengthy, carbonaceous residues may in some instances remain in the substrate, and the ceramic portions surrounding the copper metallurgy may be porous.

SUMMARY OF INVENTION

An object of this invention is to provide an improved process for producing self-bonded elements of ceramic and/or glass materials wherein the particulate ceramic and/or glass materials are coated with a surface modification layer that prevents direct interaction of the binder with particulate surface active sites, obtains a better dispersibility of particles in the slurry and ultimately promotes a cleaner and faster removal of the binder resin and associated organic materials during the burn-off phase.

Another object of the invention is to provide a method of binder burn-off at relatively low temperatures in a non-oxidizing environment that results in a sintered ceramic material with improved electrical resistivity and dielectric characteristics that are favorable for high speed electrical performance.

Another object of the invention is to provide surface modification of glass powder to provide a protective and solvent resistant interface which precludes the ingress and/or chemical interaction of the organic binder system during the slurry preparation for ceramic sheet casting.

Another object is to provide a method to promote accelerated burn-off of organic materials in an article shaped from a slurry of ceramic and/or glass materials and organic materials.

In accordance with the aforementioned objectives this invention is based on the discovery that in a process for producing sintered ceramic and/or glass elements where a slurry is prepared from particulate ceramic and/or glass materials, an organic binder resin, and a solvent for the resin, the element shaped from the slurry, and the element heated to burn-off the organic material and fuse the ceramic and/or glass particles; a significant improvement is obtained by coating the particles with a silane, a silazane, or an organo titanate by pretreatment of the ceramic powder with these materials, or by in situ modification in the process of slurry preparation.

DESCRIPTION OF THE PREFERRED EMBODIMENT

This invention basically alters the chemistry of the conventional ceramic slurry used to shape ceramic particles and elements. Slurries conventionally include particulate ceramic material, an organic binder resin, a solvent for the resin binder, and frequently other ingredients such as plasticizers, wetting agents, etc. When the ceramic is a high temperature sintering material, such as alumina, high temperatures are used to burn off the organic materials of the slurry and fuse the alumina particles. Under these high temperature burn-off and sintering conditions, the organic material removal is relatively complete. In a semiconductor packaging application, a conductive metal paste is applied to the sheets to form an electrically conductive pattern. However, a high burn-off and sintering temperature effectively precludes the use of high conductivity metal such as copper, gold, silver, etc. in the package substrate because desirable high conductivity metals will melt and vaporize and/or be oxidized at these temperatures. Such high burn-off and sintering temperatures require the use of refractory metals, such as tantalum, molybdenum, or titanium, which unfortunately have higher resistivities.

Various low temperature sintering materials have been developed, such as described in U.S. Pat. No. 4,301,324 that can be sintered at much lower temperatures than alumina. U.S. Pat. No. 4,234,367 discloses and claims a low temperature process for removing the organic materials from a laminated substrate where the temperature and ambient conditions are controlled to protect the copper metal lines and vias forming the metallurgy system. This patented process provides conditions that are sufficient to burn off and/or vaporize the organic materials without oxidizing the copper metallurgy.

While the process meets the objective and needs for producing a multilayered ceramic substrate with a copper metallurgy system, the conditions must be very carefully controlled, and the time for completely removing the organics is relatively long.

This invention is a process for changing the surface chemistry of the ceramics and/or glass particles that result in a faster and more complete removal of the organics during the burn-off and sintering operation, thereby reducing the cost of the product, increasing the yield, and enhancing the quality of the element or article. In the invention the ceramic and/or glass particles are initially coated with a material that apparently interacts with the reactive sites such as the surface hydroxyl groups on the ceramic and glass particle surfaces, and thereby influences the relationship between the particles and the organic materials of the slurry. Although the nature of the interaction is not known or understood, it is clear from experimental evidence that the particle coating of the invention has unexpected beneficial effects, i.e. a faster and more complete removal of the organic materials during the burn-off stage, and an enhancement of the electrical properties of the resultant sintered material.

The method of the invention is applicable to all processes for shaping elements and articles from a ceramic and/or glass slurry. However, it is particularly relevant to the fabrication of multilayer ceramic substrates used for semiconductor packaging, and most relevant to a fabrication process for fabricating a glass/ceramic substrate with a copper metallurgy pattern.

All types of ceramics can be used in the practice of the invention including alumina, mullite and various mixtures thereof but the greatest benefit is achieved with low sintering temperature materials. The most preferred inorganic sinterable material can be characterized as a glass-ceramic material. Such materials are described in U.S. Pat. No. 4,301,324 which disclosure is incorporated in this specification by reference. In general, glass-ceramic materials are characterized as devitrified or crystallized forms of glass whose properties can be made to vary over a wide range. In brief, glass ceramics are sintered through the controlled, in situ crystallization of a glass body of proper composition brought about by a two-step heat treatment procedure. The glass composition generally includes substances called nucleating agents, examples of which are $TiO_2$, $ZrO_2$, $P_2O_5$, $SnO_2$, and certain colloidal metal particles. The resultant body is composed of a multitude of fine grained crystals of substantially uniform size homogeneously dispersed in a glassy matrix, the crystal phase constituting the major portion of the body. The high degree of crystal energy, their very small dimensions, and the absence of porosity make these glass ceramics generally superior in strength to precursor glasses, and other properties such as thermal expansivity, chemical durability, etc. closely resemble those of the crystalline phase form. These materials are particularly desirable for multilayer ceramic substrates for semiconductor packages because they can be tailored to have a coefficient of expansion that closely matches that of silicon, and the dielectric constants can be tailored to a relatively low value thereby improving and increasing the speed of operation of the device.

Any suitable binder resin system that is compatible with the materials of the surface modification element can be used in the practice of this invention. The binder resin system will normally be comprised of the solvent soluble thermoplastic organic polymer having film forming properties which are non-volatile at moderate temperatures, but which will volatalize with other constituents of the resin system on firing of the green ceramic to the final sintered or vitrified state. Typical of the binders contemplated for use in accordance with this invention are described more fully in the Parks U.S. Pat. No. 2,966,719. The binder resin may contain other additives such as plasticizers and surfactants which are soluble in the solvent mixture and which are volatalized during firing of the green ceramic to the sintered state. The use of a plasticizer imparts flexibility to the polymer film and, in turn, to the green ceramic sheets to maintain in them the necessary mechanical integrity and renders them moldable, and workable prior to firing. The surfactants help in wetting of the ceramic by reducing the interfacial tension between the particulate and polymer solution. A wide range of polymers and surfactants may be employed in the binder system and the selection may be made in accordance with techniques known in the art and illustrated in U.S. Pat. No. 2,966,719 wherein, as indicated, it is only necessary that the selected plasticizers and surfactant be compatible with the base polymer of the resin binder system.

The solvent system, or mixture, is a volatile fluid whose function is to completely dissolve the binder resin system into a "binder solution" to effect uniform mixing of the binder system with a ceramic particulate and to provide sufficient fluidity to the ceramic slurry for subsequent casting into a cohesive sheet.

It is preferable that in the practice of our invention, the particles of the ceramic and/or glass material, be cleaned prior to coating in order to eliminate all traces of organic impurities that may be present on the particles. A convenient cleaning technique is to place the particulate material in a suitable crucible or container and heat in a furnace in air at a temperature up to 600° C. for a suitable time, preferably up to 24 hours. Following the heating, a wet oxygen gas is flushed through the furnace. The purity level of the particulate material can be tested by fusing a pressed compact of the powder in a nitrogen atmosphere and examining the color of the sintered ceramic.

The particulate ceramic and/or glass material is coated with the surface modification agent by dispersing the material ultrasonically in the chosen surface modification compound dissolved in a suitable solvent, as for example, cyclohexane tetrahydrofuran, methyl isobutyl ketone-methanol mixtures, toluene. After treating the particulate material, the dispersion is allowed to settle for sometime and the supernatent liquid is separated. The sedimented powder can be dried in a vacuum oven maintained at about 120° C. for 3 to 4 hours. The treated powder is of a free-flowing nature with no detectable agglomerates in it.

The surface modification agents found to provide an effective coating on the particulate material include organo silanes, organo silazanes, organo titanium chelates, and organo titanium esters. These compounds form very thin coatings on the glass particles that enhance the efficiency of the removal of the organic binder as evidenced by the carbon residue-free condition during the binder burn-off, and sintering operation, and produce sintered ceramic and glass-ceramic materials with improved electrical and dielectric characteristics for use in high performance packaging application. When the ceramic particles are treated with the surface modification compounds, it is theorized that the hydroxyl groups present on the surface of the ceramic particles undergo ligand exchange with the modification compound molecules thereby forming a chemically bonded very thin surface coating. It is this coating of material that the provides beneficial results discussed previously.

It is theorized that the silane and silazane compounds, listed as suitable coatings for particulate ceramic and glass materials, interact with the particulate materials and thereby passivate blanketing various active molecular groups on the particle surfaces which might otherwise catalyze the formation of carbon residue. The titanate compounds, listed as suitable coatings for particulate ceramic and glass materials also perform this function, but in addition provide a catalyst that promotes binder burn-off to form gaseous products that are swept away. Titanium is a transition metal which has catalytic properties.

The optimum conditions for using the various modification agents in the practice of the invention will vary. For example, certain modification agents work better than others for burning off specific organic binders used in the slurry. Also, the burn-off temperatures may vary, as well as the environment. However, the optimization of the process following the teachings of the invention are believed to amount to an exercise of engineering skill.

Any suitable organo silane compound capable of achieving improved burn-off of the organic binder can be used in the practice of the invention. Preferred organo silanes are N, N-dimethylamino, trimethylsilane, bis, hexamethy disilazane, and octamethy cyclotetrasilazane.

Another surface modification compound for use in the practice of the invention are titanium esters, having isopropoxy, phosphate, pyrophosphate, benzene sulfonyl, oxyacetate, and ethylenoxy ligands.

The titanium esters can be more specifically characterized as follows:

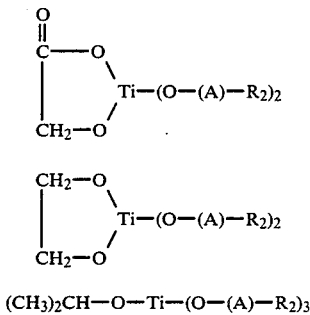

where A is a radical of the type

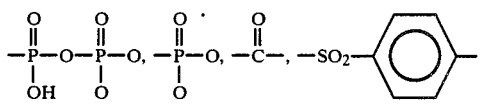

and R is a hydrocarbon radical of $C_nH_{2n+1}$ where n=6 to 17. Materials in this type are commercially available from Ken Rich Chemical Corporation, e.g. isopropyl tri(dioctylpyrophosphate) titanate, titanium di (dioctylphrophosphate) oxyacetate, di (dioctylpyrophosphate) ethylene titanate, and isopropyl tridodecyl benzene sulfonyl titanate. Other titanium esters that can be utilized are of the formula $Ti(OR')_4$ where R' is hydrocarbon group preferably with 3-12 carbon atoms, e.g. isopropyl, butyl, pentyl, 2-ethyl hexyl etc.

Titanium chelates used in the practice of the invention are cyclic complexes formed by the reaction of titanium alkoxides with organic ligands which serve as donor sites for titanium. These chelates can be represented by the following general formula:

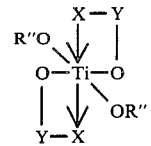

where X represents a carbonyl group of a ketone, aldehyde or ester, or an amino group, and Y represents a 2 or 3 carbon atom chain, and R represents a 3–5 carbon unit joined with oxygen through a secondary or tertiary carbon atom. Typical titanium chelates are titanium acetyl-acetonate, titanium ethanolamine chelate, titanium lactic acid chelate, octylene glycol titanate, titanium acetoacetate chelate. These reagents are commercially available from E. I. DuPont de Nemours and Company under the trade names "Tyzor" organic titanates or from Kenrich Chemicals Corp. under the trade name "Ken-React".

The following Examples are disclosed to depict preferred specific embodiments of the invention and are not intended to unduly limit the scope of the claims thereto.

EXAMPLE I

Glass ceramic cullets of cordierite, with 2 MgO·2Al$_2$O$_3$·5SiO$_2$, as the principle phase, were prepared in the laboratory. The glass ceramic is described in U.S. Pat. No. 4,301,324 by A. H. Kumar et al, whose teachings are incorporated herein by reference.

The glass-ceramic cullets were ball milled using alumina balls as grinding media and distilled water as a vehicle. The milling was performed for 24 hours. The slurry was filtered through a 40 micron mesh into a steel pan in order to separate the unground cullets as well as the alumina balls. The slurry was then dried fully by keeping it in an oven maintained at 90° C. for 10 hours. The dried precipitate was then crushed into a fine powder using a spatula. The resultant ball milled powders were subjected to a thermal cleaning operation in order to eliminate traces of organic impurities present in the powders. The powder was placed in an alumina crucible and heated in a Lindbergh tubular furnace at 600° C. for 24 hours. A wet oxygen gas was flushed through the furnace at a rate of 6 liters per minute. The purity level of the powder was later tested by firing a pressed compact of the powder in a Nitrogen atmosphere and the color of the sintered ceramic was examined. The cleaned glass ceramic particulate was divided into 10 equal volumes and the particles of each volume were coated with one of the compounds listed in the Table below.

After separating the liquid and drying the powders, they were combined with polyvinlybutyral resins and a solvent for the resin to form ceramic slurries. The same procedure was followed for each of the ceramic powders with the different surface modifier compounds. The slurries were each doctor bladed, pressed, and dried to form separate specimens. All of the pressed samples were slowly heated from room temperature to 750° C. at a rate of 2° C. per minute. The temperature was held constant at 750° C. for 6 hours. Most of the organics volatilized at this stage. Then the temperature was further raised to 960° C. at the same heating rate and then held constant for 2 hours. At this temperature the ceramic underwent complete densification. A dry nitrogen gas was flushed through the furnace during the firing process. The color of each sample was examined visually after the firing stage. Fully purified powder revealed a clean white ceramic with no apparent carbon residue in it. The following table depicts the results of Example and indicates the effectiveness of each surface modifier compound tested.

| Organic Burn-off Studies of Glass-Ceramics With Silanes Under $N_2$ Atmosphere | | | |
|---|---|---|---|
| Name of Silane | White | Medium Gray | Dark Gray |
| γ-aminopropyl triethoxy silane | | | X |
| Dichlorotetramethylsiloxane | | | X |
| Decamethyl tetrasiloxane | | X | |
| Methyltriethoxysilane | | | X |
| Bis (Trimethyl amino methyl silane | | | X |
| Octamethylcyclotetra silazane | X | | |
| Hexamethyl disilazane | X | | |
| N,N—Dimethyl amino trimethyl silane | X | | |
| Bis (trimethyl siloxymethyl silane | | X | |
| N,N—Diethyl aminotrimethyl silane | | | X |

It is noted that 3 compounds were very effective as surface modifier compounds to facilitate the complete removal of the binder resin and solvent. The three compounds were octamethylcyclotetrasilazane, hexamethyl disilazane, and N,N-dimethylamino trimethylsilane.

The carbon left in the samples impart a darker color to the samples. The lighter the color of the sample, the more complete is the burn-off of the binder resin, and consequently the more desirable ceramic product.

EXAMPLE II

One-hundred parts of a glass ceramic powder with cordierite $2MgO \cdot 2Al_2O_3 \cdot 5SiO_2$, as the main crystalline phase, similar to the glass described in Example I was treated with 300 parts of tetrahydrofuran containing 0.7 parts (by weight of ceramic powder) of titanium di(dioctylpyrophosphphate) oxyacetate by stirring for four hours at room temperature. The solvent was then removed by spin evaporation, and the powder dried under vacuum for complete removal of the volatiles. The treated ceramic powder was used to prepare a slurry by ball milling with a polyvinylbutyral organic binder and a solvent for the binder. A similar slurry was made with untreated powder as a control. The mixtures were then cast into green sheets, the ceramic green sheets screen printed using copper conductive paste, and the sheets laminated. The resultant substrates were fired in a controlled atmosphere. The firing cycle consisted of heating the substrates to 785° C. at 2° C./min. in $N_2$, followed by a 4 hour hold at 785° C. in steam with a $O_2$ partial pressure of $10^{-2}$ atmosphere, the temperature raised to 965° C. at 3° C./min. in $N_2$, and a 2 hour hold at 965° C. in $N_2$ followed by cooling to room temperature in $N_2$. In order to evaluate the effects of surface modification of the glass powder with organo titanate on the binder burn-off in the sintering cycle, the electrical resistitivity of each of the substrates were measured and compared. The resistivity of the substrate formed with titanate treated powder was $1 \times 10^{14}$ ohm-cm, the resistivity of the control was $7.4 \times 10^5$ ohm cm. The high resistivity of the substrate formed of treated ceramic powder indicated a more complete binder burnoff.

EXAMPLE III

One-hundred parts of glass ceramic powder of the same composition as in Example II was suspended in 100 parts toluene and treated (with stirring) with 0.9 parts of isoproply-tri(dioctylpyrophosphate) titanate dissolved in 100 parts of toluene. The mixture was stirred for 3 hours under nitrogen atmosphere at room temperature after which the solvent was removed under vacuum and the powder was dried at 50° C. in vacuum. The treated powder was processed as described in Example II to form ceramic which had electrical resistivity and dielectric properties similar to the fired ceramic of Example II.

EXAMPLE IV

One-hundred parts of a glass ceramic powder was mixed with 7 parts of polyvinylbutyral, 1.7 parts plasticizer and 37 parts solvent system made up of 28 parts of methyl isobutyl ketone and 9 parts of methanol. This mixture was doped with 0.5 parts of titanium acetyl acetonate ("TYZOR" TAA available from DuPont as 75% solution in isobopropanol) and the total mixture was ball milled as in Examples II and III to form the casting slurry and processed as described previously. The fired ceramic obtained after sintering had very light-gray color in comparison to the dark gray color of the ceramic sample generated without the addition of the titanium reagent.

EXAMPLE V

The same basic procedure described in Example II was used to prepare a laminated green ceramic substrate and a control substrate except that the glass ceramic powder of the sample substrate was coated with titanium di(dioctyl pyro phosphate) oxyacetate. The particles of the sample were treated with 300 parts of tetrahydrofuran containing 1% (by weight of ceramic powder) of modification compound. The firing cycle of the sample and control substrates was the same as described in Example II. The resistivity of the sample substrate was measured and determined to be $2.4 \times 10^{15}$ ohm-cm. This compares very favorably with a resistivity of $7.4 \times 10^5$ ohm-cm for the control substrate. The dielectric constant of the sample substrate was 4.7. The dielectric constant of the control substrate could not be measured because the porosity was too high. The substrate formed with also had a desirable flat response of the dielectric constant, with a nominal value of 4.7 over a range of $10^4$ to $10^7$ Hz.

EXAMPLE VI

The same basic procedure described in Example II was used to prepare a green ceramic substrate and a green ceramic control substrate, except that the particles of the sample substrate were coated with neo alkoxy tri(dioctyl pyro phosphate) titanate. The coating material constituted 0.2% by weight of the weight of the glass ceramic powder. The laminated green substrates were subjected to a burn-out cycle. The cycle consisted of heating to 730° C. at 5° C./min. in wet (3.5% $H_2O$) $N_2$. The substrates were held at 730° C. for approximately 4 hours in the same ambient. The evolution of $CO_2$ was monitored during the hold as an indication of the rate of removal of carbonaceous residue. The $CO_2$ signal in the furnace exhaust was monitored by infra red spectroscopy. The results were plotted and the slope of the plots of $CO_2$ signals versus time at 730° C. were calculated. The slope of the plate of the titanate coated particles was 75% greater than the slope of the control. The results indicate therefore that the titanate coating on ceramic particles significantly increases the rate of carbon removal during a burn-off cycle.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:

1. An improved method for manufacturing self-bonded elements from particulate ceramic and glass materials comprising
    forming a finely divided compound that includes particles of ceramic materials,
    coating the particles of said finely divided compound with a heat decomposable surface modification monomeric organo compound selected from the group consisting of organo silanes, organo silazanes, titanium chelates, titanium esters, and mixtures thereof,
    combining and mixing the coated particles of finely divided compound with an organic resin binder and solvent for the binder to form a slurry,
    shaping the slurry to form the desired element,
    heating the element to remove the binder, the solvent, and subsequently the coating, during said heating, the coating acting to seal or neutralize the active molecular sites on the particles, which would otherwise react with the organic binder and solvent materials in the slurry to form deliterious carbonaceous material, until at least the major portion of the organic binder and solvent materials are consumed,
    continuing the heating to fuse the particles of finely divided compound.

2. The method of claim 1 wherein said organo silazane compound is selected from the group consisting of octamethyl cyclo tetrasilazane, hexamethyl disilazane, and mixtures thereof.

3. The method of claim 1 wherein said titanium chelates has the structure

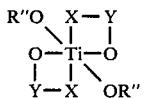

where X is a carbonyl group of a ketone, aldehyde, ester, or amino group, Y is a 2 or 3 carbon atom chain, and R" is a 3 to 5 carbon atom unit joined with an oxygen atom through a secondary or tertiary carbon atom.

4. The method of claim 3 wherein said titanium chelate is selected from the group consisting of titanium acetyl acetonate, titanium ethanalomine chelate, titanium lactic acid chelate, octylene glycol titanate, titanium ethyl acety acetate, and mixtures thereof.

5. The method of claim 1 wherein said titanate ester compound is selected from the group consisting of isopropyl tri (dioctyl pyrophosphate) titanate, titanium di(dioctyl pyrophosphate) oxyacetate, di(dioctyl pyrophosphate) ethylene titanate, and mixtures thereof.

6. The method of claim 5 wherein said modification compound constitutes 0.1 to 2% by weight of said finely divided compound.

7. The method of claim 1 wherein said surface modification compound is hexamethyl disilazane.

8. The method of claim 1 wherein said finely divided compound is a glass-ceramic material.

9. The method of claim 1 wherein adventitious surface carbonaceous residue is removed from said finely divided particles of ceramic material prior to coating of the particles with said surface modification compounds by heating said material at a temperature not less than 600° C. for a time sufficient to oxidize the residue.

10. The method of claim 9 wherein the heating phase of residue removal is done in a wet oxygen gas flow.

11. The method of claim 1 wherein said particles of finely divided particles of ceramic material are coated with said surface modification compound by dissolving said modification compound in a solvent for the compound, immersing the finely divided particles of ceramic in the dissolved modification compound, and removing and drying the finely divided particles of ceramic material.

12. The process of claim 1 wherein said slurry is doctor bladed and dried to form ceramic green sheets, and the sheets laminated to form a substrate.

13. The process of claim 12 wherein said ceramic green sheets are punched to form via holes, a conductive metal paste deposited in the via holes and on the sheets to form metallurgy lines, and the resultant sheets assembled and laminated.

14. The method of claim 13 wherein said finely divided compound is a glass-ceramic material.

15. The method of claim 14 wherein said conductive metal paste contains copper as the major electrically conductive constituent.

16. The method of claim 15 wherein the laminated substrate is heated to a temperature of the order of 750° C. in a neutral ambient, the substrate heated in a $H_2/H_2O$ ambient for a time of the order of 4 hours, and temperature subsequently increased to a temperature on the order of 960° C. in an $N_2$ ambient and held for a time not less than 2 hours.

17. The method of claim 1 wherein said particulate glass and ceramic materials are cleaned to remove all carbonaceous residue material before being coated with said surface modification compound.

18. The method of claim 17 wherein said cleaning of said particulate glass and ceramic materials is achieved by heating in air to a temperature on the order of 600° C.

* * * * *